United States Patent
Lee et al.

(10) Patent No.: US 7,499,322 B2
(45) Date of Patent: Mar. 3, 2009

(54) INTEGRATED CIRCUIT MEMORY SYSTEM WITH HIGH SPEED NON-VOLATILE MEMORY DATA TRANSFER CAPABILITY

(75) Inventors: Seung Won Lee, Gyeonggi-do (KR); Ki Hong Kim, Gyeonggi-do (KR); Sun Kwon Kim, Gyeonggi-do (KR); Byeong Hoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 139 days.

(21) Appl. No.: 11/734,082

(22) Filed: Apr. 11, 2007

(65) Prior Publication Data
US 2008/0192560 A1    Aug. 14, 2008

(30) Foreign Application Priority Data
Feb. 8, 2007    (KR) .................. 10-2007-0013351

(51) Int. Cl.
*G11C 16/04*    (2006.01)
(52) U.S. Cl. .................. 365/185.08; 365/230.03; 365/189.05
(58) Field of Classification Search ............ 365/185.08, 365/230.03, 189.05, 185.11, 185.12
See application file for complete search history.

(56) References Cited

U.S. PATENT DOCUMENTS

| | | | |
|---|---|---|---|
| 5,438,540 A | 8/1995 | Kim | |
| 6,671,204 B2 | 12/2003 | Im | |
| 6,791,877 B2 | 9/2004 | Miura et al. | |
| 6,791,882 B2 * | 9/2004 | Seki et al. | 365/185.29 |
| 6,952,368 B2 | 10/2005 | Miura et al. | |
| 7,068,562 B2 | 6/2006 | Miura et al. | |
| 2002/0120820 A1 | 8/2002 | Higuchi et al. | |
| 2004/0017708 A1 | 1/2004 | Choi et al. | |
| 2006/0047888 A1 | 3/2006 | Nishihara et al. | |

FOREIGN PATENT DOCUMENTS

| | | |
|---|---|---|
| JP | 2002-219149 A | 8/2002 |
| JP | 2005-250907 A1 | 9/2005 |
| JP | 2006-65533 A | 3/2006 |
| KR | 2001-0076518 A | 8/2001 |
| KR | 10-0448905 B1 | 9/2004 |
| KR | 10-2006-0090088 A | 8/2006 |

* cited by examiner

*Primary Examiner*—David Lam
(74) *Attorney, Agent, or Firm*—Myers Bigel Sibley & Sajovec

(57) ABSTRACT

An integrated circuit memory system includes an integrated circuit device having a random access memory array, a non-volatile memory array (e.g., flash memory array) and a data transfer circuit therein. The memory arrays and data transfer circuit may be included in a common integrated circuit chip. The random access memory (RAM) array includes a plurality of columns of RAM cells and a first plurality of bit lines, which are electrically connected to the plurality of columns of RAM cells. The non-volatile memory array includes a plurality of columns of non-volatile memory cells and a second plurality of bit lines, which are electrically connected to a plurality of columns of non-volatile memory cells. The data transfer circuit is electrically connected to the first and second pluralities of bit lines. The data transfer circuit is configured to support direct bidirectional communication between the first and second pluralities of bit lines.

16 Claims, 8 Drawing Sheets

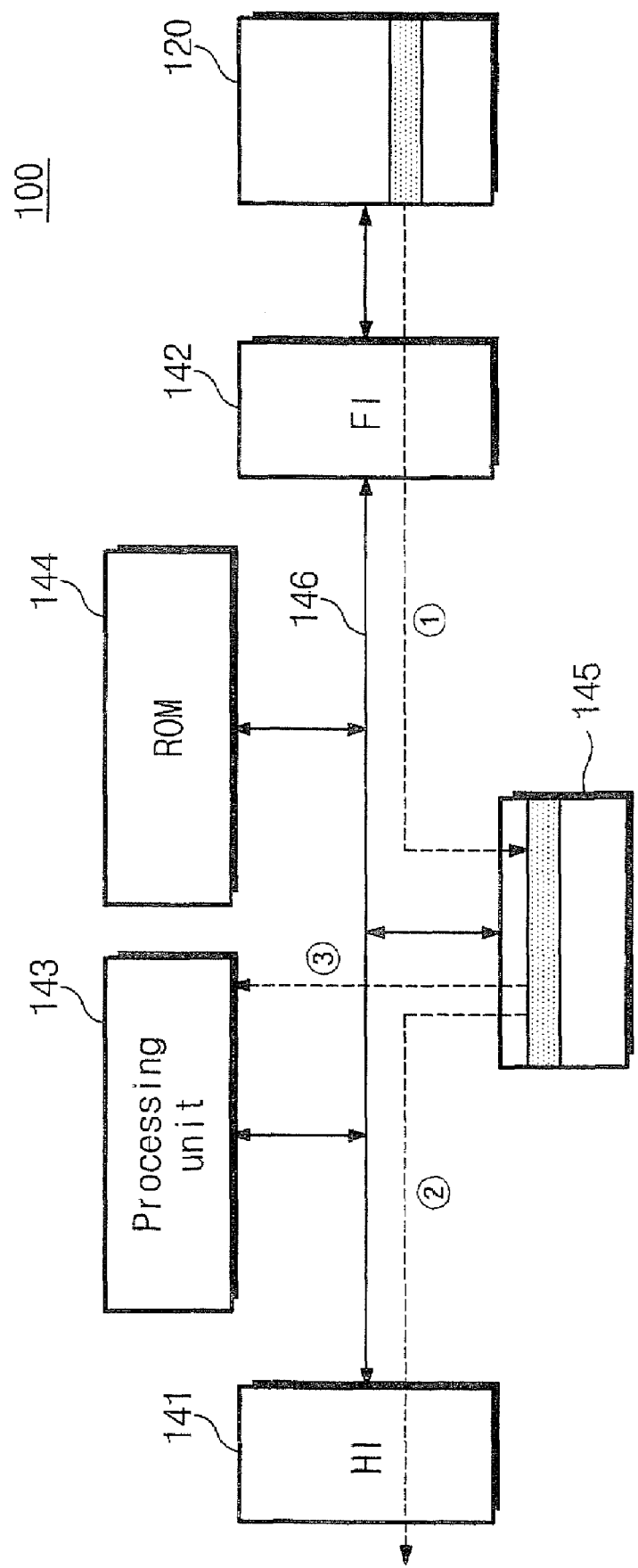

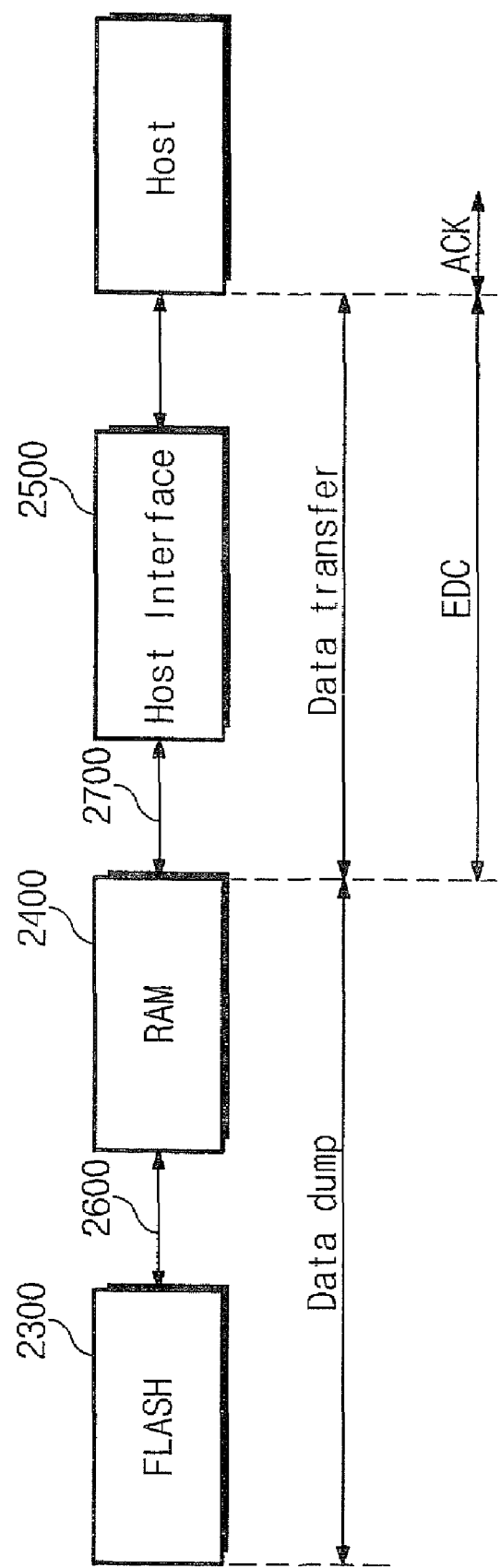

INTEGRATED CIRCUIT MEMORY SYSTEM WITH HIGH SPEED NON-VOLATILE MEMORY DATA TRANSFER CAPABILITY

REFERENCE TO PRIORITY APPLICATION

This application claims priority under 35 USC § 119 to Korean Application Serial No. 2007-0013351, filed Feb. 8, 2007, the disclosure of which is hereby incorporated herein by reference.

FIELD OF THE INVENTION

The present invention relates to integrated circuit devices and, more particularly, to integrated circuit memory devices and systems and methods of operating same.

BACKGROUND OF THE INVENTION

Integrated circuit memory systems that utilize non-volatile memory devices in combination with random access memory devices may support a data dumping operation that occurs in response to a read instruction received at an interface of the memory system. In a conventional data dumping operation, a page of data stored in a non-volatile memory device may be initially transferred over a bus to a random access memory before subsequent transfer from the random access memory to an interface (e.g., host interface) of the memory system. This dumping operation, which typically takes many clock cycles to complete, may involve data transfer between a non-volatile memory device and a random access memory device that are integrated within a common semiconductor substrate.

FIG. 1 illustrates a conventional memory system 100 having a plurality of interconnected memory devices therein. In particular, the memory system 100 is illustrated as including a host interface 141, a read-only memory (ROM) 144, a random access memory (RAM) 145 and a non-volatile memory device 120. This non-volatile memory device 120, which may be a flash memory device, may be communicatively coupled by an interface unit (FI) 142 to the system bus 146. A processing unit 143 (a/k/a processor) is also provided to control operation of the components of the memory system 100. This processing unit 143 is communicatively coupled by the system bus 146 to the other components of the memory system 100.

As illustrated by the dotted lines (1) and (2) shown in FIG. 1, a request for non-volatile memory data, which may be issued by a host processor (not shown) and received at the host interface 141, may result in a first transfer of non-volatile memory data (e.g., page of data) from the non-volatile memory device 120 to the random access memory device 145, via the system bus 146. A second data transfer operation may then be performed, under control of the processing unit 143, to transfer the data to the host interface 141. Alternatively, if the original request for non-volatile memory data is issued by the processing unit 143, then the second data transfer operation may include transferring data from the random access memory device 145 to the processing unit 143, as illustrated by dotted line (3).

As will be understood by those skilled in the art, the timing delays associated with the data transfer paths ((1) and (2) or (1) and (3)) illustrated by FIG. 1 may increase as the page capacity of the non-volatile memory device 120 is increased. This increase in delay may result in an unacceptably long latency between the time a read instruction is received at the host interface 141 and the time the "read" data is first made available to the system bus 146 for transfer to the host interface 141.

SUMMARY OF THE INVENTION

Integrated circuit memory systems according to embodiments of the present invention include an integrated circuit device having a random access memory array, a non-volatile memory array (e.g., flash memory array) and a data transfer circuit therein. The memory arrays and data transfer circuit may be included in a common integrated circuit chip. The random access memory (RAM) array includes a plurality of columns of RAM cells and a first plurality of bit lines, which are electrically connected to the plurality of columns of RAM cells. The non-volatile memory array includes a plurality of columns of non-volatile memory cells and a second plurality of bit lines, which are electrically connected to a plurality of columns of non-volatile memory cells. The data transfer circuit is electrically connected to the first and second pluralities of bit lines. The data transfer circuit is configured to support direct bidirectional communication between the first and second pluralities of bit lines. This communication occurs when transferring non-volatile memory data directly from the second plurality of bit lines to the first plurality of bit lines and transferring RAM data directly from the first plurality of bit lines to the second plurality of bit lines. The data transfer circuit may include transmission gates (e.g., CMOS transmission gates), which are utilized to provide the direct bidirectional communication between the first and second pluralities of bit lines.

The integrated circuit device may also include a page buffer electrically coupled to the second plurality of bit lines and a column selection circuit. The page buffer is configured to drive the second plurality of bit lines with data read from the non-volatile memory array when the data transfer circuit is enabled to support transfer of non-volatile memory data from the second plurality of bit lines to the first plurality of bit lines during a data dumping operation. A first plurality of complementary bit lines may also be provided with the RAM array along with a plurality of tri-state inverters. These tri-state inverters may have inputs and outputs electrically connected to corresponding ones of the first plurality of bit lines and corresponding ones of the first plurality of complementary bit lines, respectively. These tri-state inverters operate to drive the first plurality of complementary bit lines with complementary data levels relative to the data provided to the first plurality of bit lines by the data transfer circuit. An array of sense amplifiers for the RAM array may also be provided. This array of sense amplifiers is electrically connected to the first plurality of bit lines and the first plurality of complementary bit lines.

According to additional embodiments of the present invention, a RAM page buffer is provided with the RAM array. This page buffer, which is electrically connected to the first plurality of bit lines, is configured to read data from the non-volatile memory array when the data transfer circuit is enabled to support transfer of non-volatile memory data from the second plurality of bit lines to the first plurality of bit lines.

Still further embodiments of the present invention include an integrated circuit chip having a RAM device, a non-volatile memory device and a data transfer circuit therein. The RAM device includes an array of RAM cells electrically connected to a first plurality of bit lines and the non-volatile memory device includes an array of NAND-type memory cells electrically connected to a second plurality of bit lines. The data transfer circuit is electrically connected to the first and second pluralities of bit lines. The data transfer circuit is configured to support direct bidirectional communication between the first and second pluralities of bit lines when transferring non-volatile memory data directly from the second plurality of bit lines to the first plurality of bit lines and transferring RAM data directly from the first plurality of bit lines to the second plurality of bit lines. This integrated circuit chip also includes a first input/output circuit electrically coupled to the RAM device and a second input/output circuit electrically coupled to the non-volatile memory device. Host interface terminals may also be provided on the integrated circuit chip, which are electrically coupled to the first input/output circuit. A processing circuit may also be provided. This processing circuit is configured to perform error detection and correction operations on non-volatile memory data read from the second input/output circuit concurrently with operations to transfer data from the RAM device to the host interface terminals. The processing circuit may be further configured to perform the error detection and correction operations concurrently with operations to transfer data from the non-volatile memory device to the RAM device via the data transfer circuit.

BRIEF DESCRIPTION OF THE DRAWINGS

FIG. 1 is a block diagram of a conventional data processing device having non-volatile and random access memories therein, which illustrates data flow paths therein during operations to read data from a non-volatile memory.

FIG. 4B is a block/timing diagram that illustrates operations performed by the memory system of FIG. 4A.

DESCRIPTION OF PREFERRED EMBODIMENTS

Figure 2A:
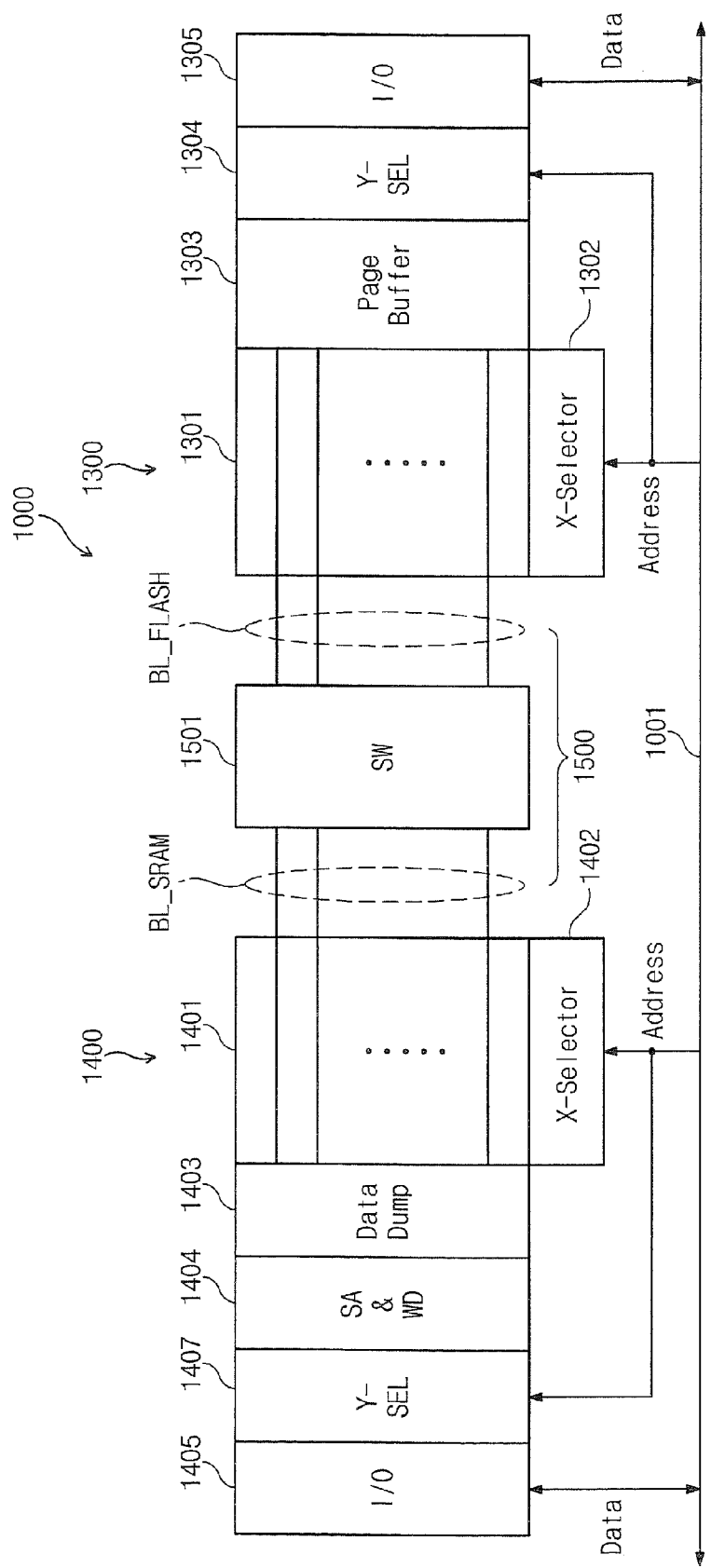
FIG. 2A is a block diagram of a portion of a high speed memory system, according to some embodiments of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout. Signals may also be synchronized and/or undergo minor boolean operations (e.g., inversion) without being considered different signals. The prefix symbol "n" to a signal name may also denote a complementary data or information signal.

FIG. 2A is a block diagram of a portion of a high speed memory system 1000, according to some embodiments of the present invention. In particular, FIG. 2A illustrates a non-volatile memory device 1300 that is directly connected by a wide bus and a data transfer circuit 1500 to a random access memory device 1400. As illustrated more fully herein, the non-volatile memory device 1300 may be a NAND-type flash memory device and the random access memory device 1400 may be a static random access memory (SRAM) device. The non-volatile memory device 1300 is illustrated as including a non-volatile memory array 1301 arranged as a plurality of side-by-side columns of non-volatile memory cells (e.g., EEPROM cells). Each of these columns of non-volatile memory cells is illustrated as being electrically coupled to corresponding bit lines (BL_FLASH). The non-volatile memory array 1301 is also electrically coupled to a page buffer 1303, which may be of conventional design, and a row selection circuit 1302 (X-Selector), which is responsive to a row address (first portion of ADDRESS). One example of a page buffer that may be utilized within a non-volatile memory device is disclosed in U.S. Pat. No. 6,671,204 to Im, entitled "Nonvolatile Memory Device with Page Buffer Having Dual Registers and Methods of Using the Same", the disclosure of which is hereby incorporated herein by reference. The input/output path of the non-volatile memory device 1300 includes a column selection circuit 1304 (shown as Y-SEL), which is responsive to a column address (second portion of ADDRESS), and an input/output circuit 1305. This input/output circuit 1305 is electrically coupled to a data bus 1001 within the high speed memory system. The column selection circuit 1304 and input/output circuit 1305 of FIG. 2A may be of conventional design and need not be described further herein.

The random access memory device 1400 is illustrated as including a random access memory array 1401 arranged as a plurality of side-by-side columns of memory cells (e.g., SRAM cells). Each of these columns of memory cells is illustrated as being electrically coupled to corresponding bit lines (BL_SRAM). The memory array 1401 is also electrically coupled to a data dumping circuit 1403 and a row selection circuit 1402 (X-Selector), which is responsive to a row address (first portion of ADDRESS). The input/output path of the random access memory device 1400 includes a sense amplifier and driver circuit 1404, a column selection circuit 1407 (shown as Y-SEL), which is responsive to a column address (second portion of ADDRESS), and an input/output circuit 1405. This input/output circuit 1405 is electrically coupled to the data bus 1001. The sense amplifier and driver circuit 1404, the column selection circuit 1407 and the input/output circuit 1405 of FIG. 2A may be of conventional design and need not be described further herein.

Figure 2B:
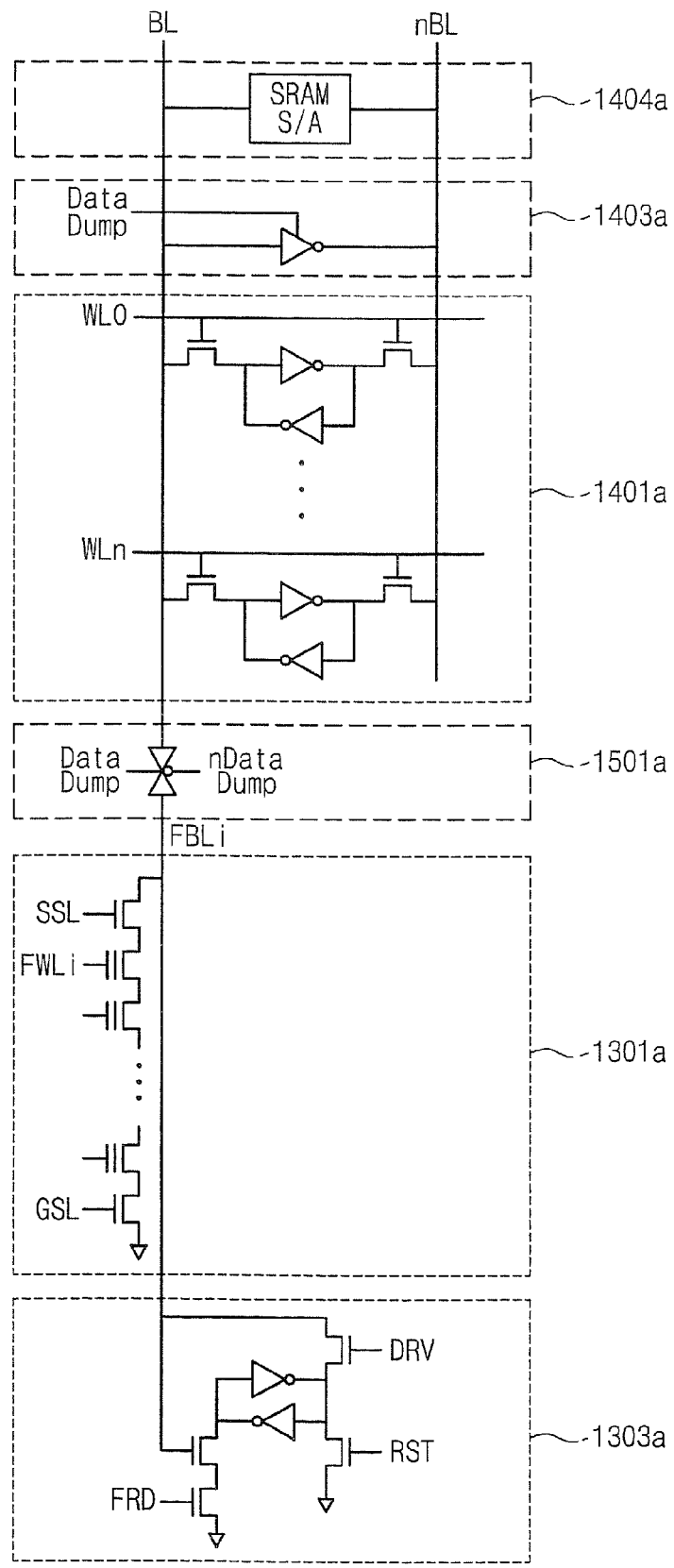
FIG. 2B is an electrical schematic illustrating a column-to-column slice of the high speed memory system components illustrated by FIG. 2A, according to some embodiments of the present invention.

FIG. 2B is an electrical schematic illustrating a portion of a column-to-column slice of some of the high speed memory system components illustrated by FIG. 2A. In particular, FIG. 2B illustrates a NAND-type string of EEPROM cells 1301a, which is electrically coupled to a corresponding bit line FBLi. The NAND-type string is illustrated as including a first NMOS transistor having a gate terminal responsive to a string selection signal SSL and a second NMOS transistor having a gate terminal responsive to a ground selection signal GSL. The NAND-type string also includes a string of EEPROM transistors having control gate electrodes responsive to corresponding word line signals (FWLi). A portion of a page buffer cell 1303a is also illustrated. This portion of a page buffer cell 1303a, which is electrically connected to a corresponding bit line FBLi, is illustrated as including a latch and a plurality of NMOS transistors, connected as illustrated. As shown, the latch may be formed as a pair of inverters, connected in antiparallel. The plurality of NMOS transistors include an NMOS transistor responsive to flash read signal FRD, an NMOS transistor responsive to a reset signal RST and an NMOS transistor responsive to a bit line drive signal DRV. Setting the reset signal RST to a logic 1 level causes a reset of the latch in advance of a memory read operation. Setting the flash read signal FRD to a logic 1 level during a read operation operates to pass data on the corresponding bit line FBLi to an output of the latch. The data at the output of the latch can then be driven back to the corresponding bit line FBLi by setting the bit line drive signal DRV to a logic 1 level so that a direct electrical connection is provided from the output of the latch to the bit line FBLi.

The data transfer circuit 1500 includes an array of switch elements (SW) 1501. As illustrated by FIG. 2B, each switch element may be a CMOS transmission gate 1501a, which is responsive to a pair of complementary data dump signals (DATA DUMP and nDATA DUMP). The random access memory array 1401 includes a column of RAM cells 1401a, which are illustrated as SRAM cells. This column of RAM cells 1401a includes access transistors having gate terminals responsive to corresponding word line signals (e.g., WL0-WLn). The data dumping circuit 1403 includes data dumping cells 1403a, which are illustrated as tri-state inverters having a control terminal responsive to the data dump signal DATA DUMP. Each of these inverters receives a data signal on a corresponding bit line BL and drives a corresponding complementary bit line nBL with an inverted data signal. These data signals are passed to a sense amplifier cell 1404a so that the data signals on the bit lines within the memory array 1401 can be latched.

A direct data transfer operation may be performed from the non-volatile memory device 1300 to the RAM device 1400, using the data transfer circuit 1500. With respect to FIG. 2B, a direct data transfer operation may include resetting the latch within the page buffer cell 1303a by driving the reset signal RST to a logic 1 level for a sufficient duration to reset the latch and then switching the reset signal RST high-to-low. Thereafter, conventional operations are performed to read data from a selected cell within a NAND-type string 1301a to the corresponding bit line FBLi and pass this data to the latch within the page buffer cell 1303a by switching the read signal FRD low-to-high for a sufficient duration to latch-in the bit line data. Following this latch-in of the bit line data, the latch within the page buffer cell 1303a is used to drive the bit lines FBLi and BL with the read data by setting the drive signal DRV and the data dump signal DATA DUMP to logic 1 levels. Setting the data dump signal DATA DUMP to a logic 1 level also enables the tri-state inverter 1403a so that a differential data signal is established across the pair of complementary bit lines BL and nBL within the RAM device 1400. This differential data signal is then detected and latched by the sense amplifier cell 1404a. A selected word line (WL0-WLn) within the RAM device 1400 may then be driven to a logic 1 level so that the data latched by the sense amplifier cell 1404a is written into a selected row of RAM cells within the RAM device 1400. In this manner, non-volatile memory data can be transferred directly from the non-volatile memory device 1300 to the random access memory device 1400, via the data transfer circuit 1500.

Figure 3A:
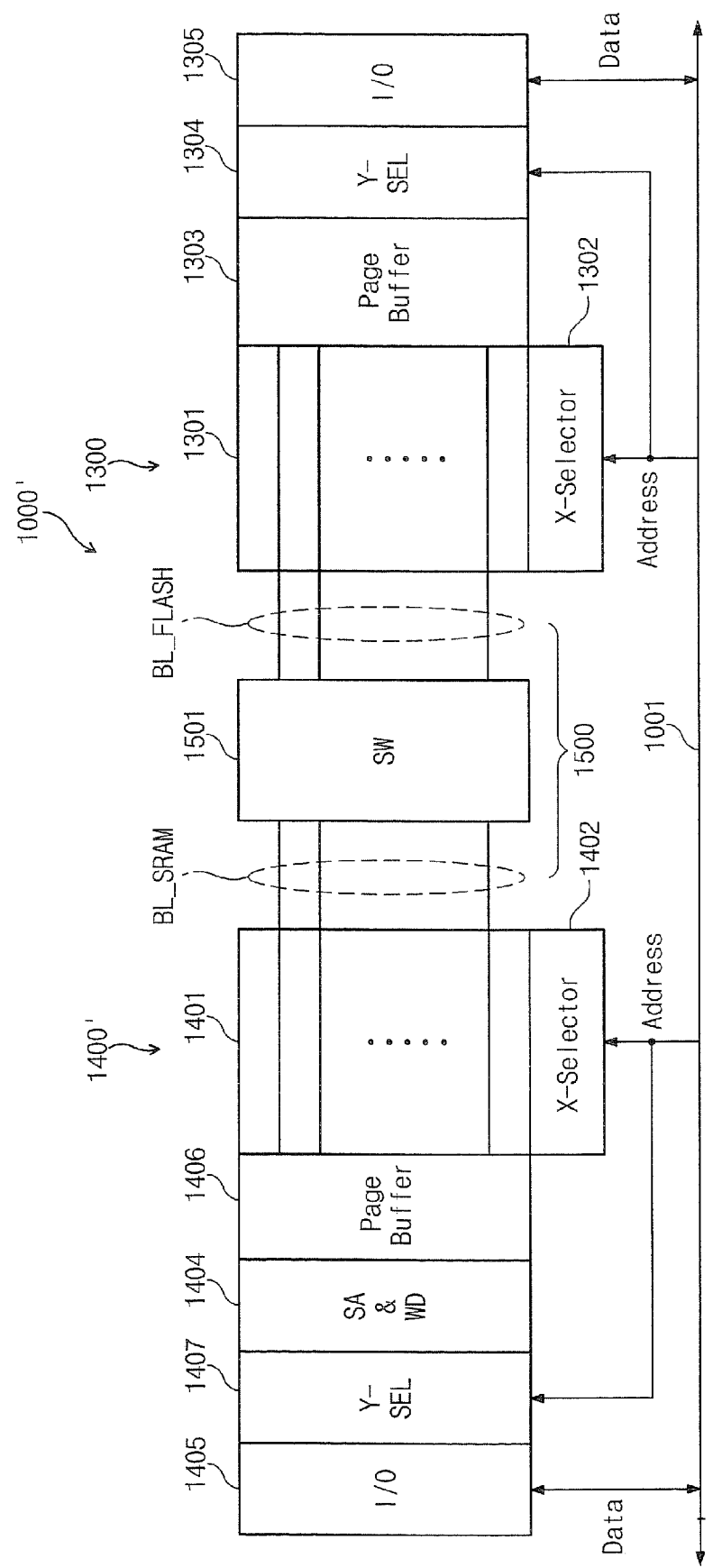
FIG. 3A is a block diagram of a portion of a high speed memory system, according to some embodiments of the present invention.

FIG. 3A is a block diagram of a portion of a high speed memory system 1000', according to additional embodiments of the present invention. In particular, FIG. 3A illustrates a non-volatile memory device 1300 that is directly connected by a wide bus and a data transfer circuit 1500 to a random access memory device 1400'. As illustrated more fully herein, the non-volatile memory device 1300 may be a NAND-type flash memory device and the random access memory device 1400' may be a static random access memory (SRAM) device. The non-volatile memory device 1300 is illustrated as including a non-volatile memory array 1301 arranged as a plurality of side-by-side columns of non-volatile memory cells (e.g., EEPROM cells). Each of these columns of non-volatile memory cells is illustrated as being electrically coupled to corresponding bit lines (BL_FLASH). The non-volatile memory array 1301 is also electrically coupled to a page buffer 1303, which may be of conventional design, and a row selection circuit 1302 (X-Selector), which is responsive to a row address (first portion of ADDRESS). The input/output path of the non-volatile memory device 1300 includes a column selection circuit 1304 (shown as Y-SEL), which is responsive to a column address (second portion of ADDRESS), and an input/output circuit 1305. This input/output circuit 1305 is electrically coupled to a data bus 1001 within the high speed memory system. The column selection circuit 1304 and input/output circuit 1305 of FIG. 3A may be of conventional design and need not be described further herein.

The random access memory device 1400' is illustrated as including a random access memory array 1401 arranged as a plurality of side-by-side columns of memory cells (e.g., SRAM cells). Each of these columns of memory cells is illustrated as being electrically coupled to corresponding bit lines (BL_SRAM). The memory array 1401 is also electrically coupled to a page buffer 1406 and a row selection circuit 1402 (X-Selector), which is responsive to a row address (first portion of ADDRESS). The input/output path of the random access memory device 1400' includes a sense amplifier and driver circuit 1404, a column selection circuit 1407 (shown as Y-SEL), which is responsive to a column address (second portion of ADDRESS), and an input/output circuit 1405. This input/output circuit 1405 is electrically coupled to the data bus 1001. The sense amplifier and driver circuit 1404, the column selection circuit 1407 and the input/output circuit 1405 of FIG. 3A may be of conventional design and need not be described further herein.

Figure 3B:
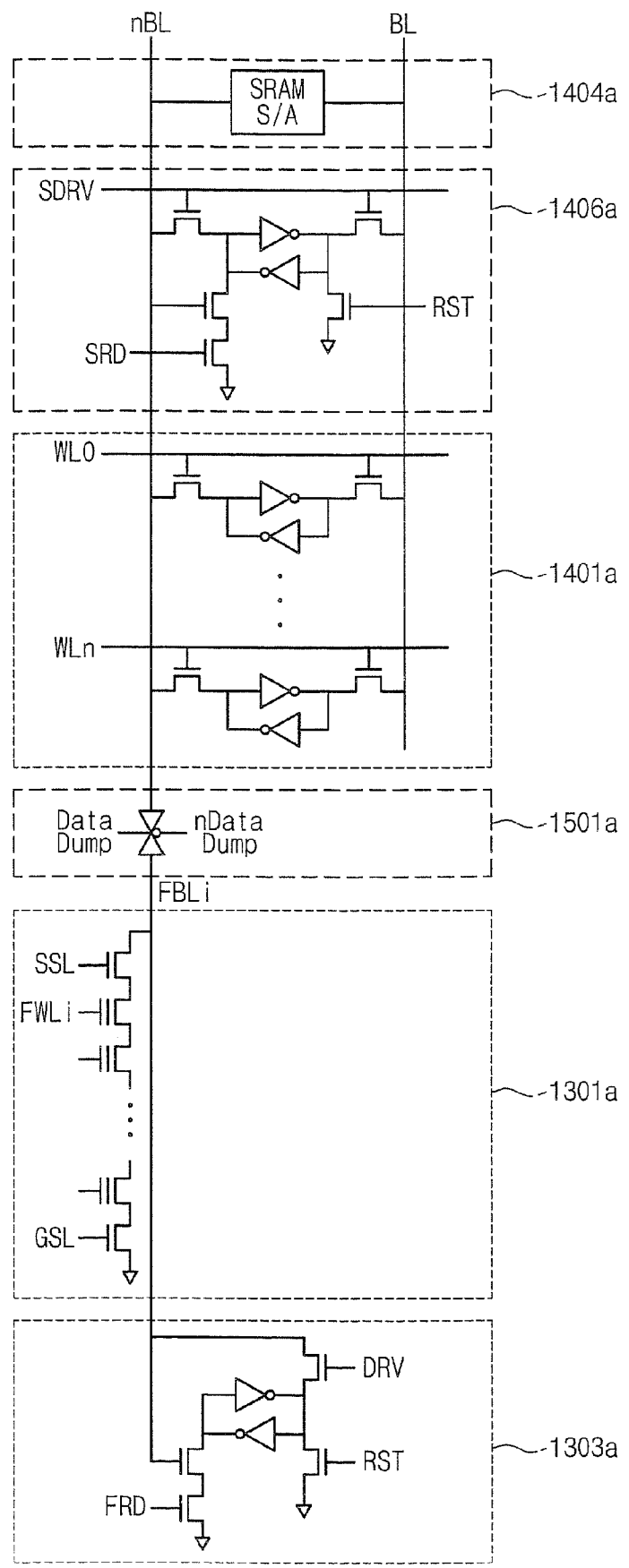
FIG. 3B is an electrical schematic illustrating a column-to-column slice of the high speed memory system components illustrated by FIG. 3A, according to some embodiments of the present invention.

FIG. 3B is an electrical schematic illustrating a portion of a column-to-column slice of some of the high speed memory system components illustrated by FIG. 3A. In particular, FIG. 3B illustrates a NAND-type string of EEPROM cells 1301a, which is electrically coupled to a corresponding bit line FBLi. The NAND-type string is illustrated as including a first NMOS transistor having a gate terminal responsive to a string selection signal SSL and a second NMOS transistor having a gate terminal responsive to a ground selection signal GSL. The NAND-type string also includes a string of EEPROM transistors having control gate electrodes responsive to corresponding word line signals (FWLi). A portion of a page buffer cell 1303a is also illustrated. This portion of a page buffer cell 1303a, which is is electrically connected to a corresponding bit line FBLi, is illustrated as including a latch and a plurality of NMOS transistors, connected as illustrated. As shown, the latch may be formed as a pair of inverters, connected in antiparallel. The plurality of NMOS transistors include an NMOS transistor responsive to flash read signal FRD, an NMOS transistor responsive to a reset signal RST and an NMOS transistor responsive to a bit line drive signal DRV. Setting the reset signal RST to a logic 1 level causes a reset of the latch in advance of a memory read operation. Setting the flash read signal FRD to a logic 1 level during a read operation operates to pass data on the corresponding bit line FBLi to an output of the latch. The data at the output of the latch can then be driven back to the corresponding bit line FBLi by setting the bit line drive signal DRV to a logic 1 level so that a direct electrical connection is provided from the output of the latch to the bit line FBLi.

The data transfer circuit 1500 includes an array of switch elements (SW) 1501. As illustrated by FIG. 3B, each switch element may be a CMOS transmission gate 1501*a*, which is responsive to a pair of complementary data dump signals (DATA DUMP and nDATA DUMP). The random access memory array 1401 includes a column of RAM cells 1401*a*, which are illustrated as SRAM cells. This column of RAM cells 1401*a* includes access transistors having gate terminals responsive to corresponding word line signals (e.g., WL0-WLn). The page buffer 1406 includes an array of page buffer cells 1406*a*, which are connected to corresponding pairs of bit lines nBL and BL stemming from the RAM array 1401. Each page buffer cell 1406*a* is illustrated as including a latch, which is shown as a pair of inverters, and a pair of NMOS access transistors having gate terminals responsive to an SRAM drive signal SDRV. The state of the latch may be reset by driving the reset signal line RST with a logic 1 pulse to thereby pull the output of the latch to a logic 0 level via an NMOS pull-down transistor. As illustrated, this NMOS pull-down transistor has a gate terminal electrically connected to the reset signal line RST.

Reading data into the page buffer cell 1406*a* is performed by driving the SRAM read signal SRD to a logic 1 level for a sufficient duration to enable the latch to receive data from the complementary bit line nBL, which is connected to a gate terminal of an NMOS transistor within the cell 1406*a*, as illustrated. The data stored on the latch may be driven to the corresponding pair of bit lines nBL and BL by setting the drive signal SDRV to a logic 1 level so that the access transistors are turned on to thereby electrically connect the outputs of the latch to the bit lines nBL and BL. Signals driven onto the bit lines nBL and BL may then be passed to a selected row within the RAM array 1401 by driving a selected word line (WL0-WLn) to a logic 1 level. The sense amplifier cell 1404*a* may also perform a latching function by detecting and amplifying differential signals on the bit lines nBL and BL during an operation to read data from the RAM device 1400'.

A direct data transfer operation may be performed from the non-volatile memory device 1300 to the RAM device 1400', using the data transfer circuit 1500. With respect to FIG. 3B, a direct data transfer operation may include resetting the latch within the page buffer cell 1303*a* by driving the reset signal RST to a logic 1 level for a sufficient duration to reset the latch and then switching the reset signal RST high-to-low. Thereafter, conventional operations are performed to read data from a selected cell within a NAND-type string 1301*a* to the corresponding bit line FBLi and pass this data to the latch within the page buffer cell 1303*a* by switching the read signal FRD low-to-high for a sufficient duration to latch-in the bit line data. Following this latch-in of the bit line data, the latch within the page buffer cell 1303*a* is used to drive the bit lines FBLi and nBL with the read data by setting the drive signal DRV and the data dump signal DATA DUMP to logic 1 levels. The data provided to the bit line nBL may then be latched into the page buffer cell 1406*a* by setting the SRAM read signal SRD to a logic 1 level. Following this, the SRAM drive signal SDRV may be set to a logic 1 level to turn on the access transistors within the page buffer cell 1406*a* and drive the bit lines nBL and BL with differential data that may then be written into a selected row within the RAM array 1401.

According to additional embodiments of the present invention, the wide bus and switch elements within the data transfer circuit 1500 illustrated by FIGS. 2A-2B and 3A-3B may be replaced by a direct bus connection between the two input/output circuits 1305 and 1405. This direct bus would a bus dedicated to data transfers between the non-volatile and RAM memory devices 1300 and 1400 (or 1400') Thus, unlike the data bus 1001, which is shared by many components within the memory systems 1000 and 1001', the direct bus would be an additional bus shared only by the RAM and non-volatile memory devices.

Figure 4A:
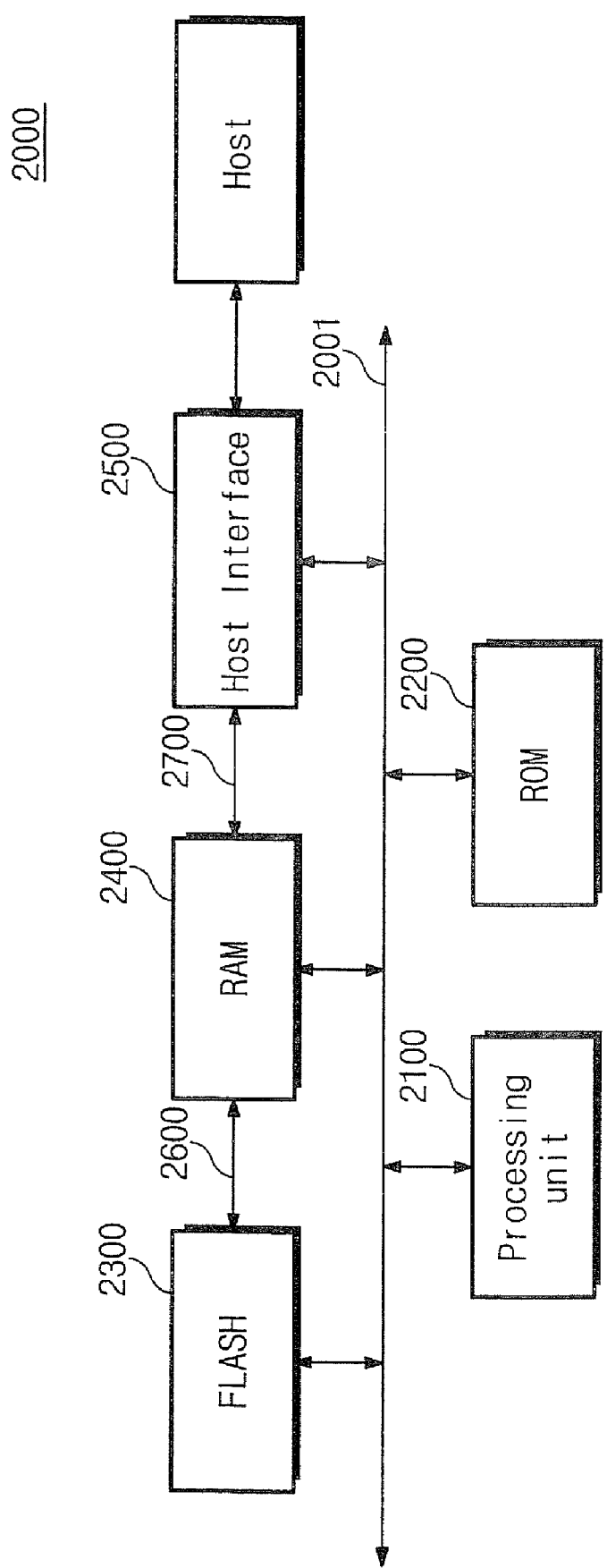
FIG. 4A is a block diagram of a high speed memory system according to additional embodiments of the present invention.

FIGS. 4A-4B illustrate a memory system 2000 according to additional embodiments of the present invention. This memory system 2000 is illustrated as including a flash memory device 2300, a RAM device 2400, a host interface unit 2500, a processing unit 2100 and a read-only memory (ROM) 2200, which may be integrated on a single integrated circuit chip. The host interface unit 2500 may include host interface terminals (e.g., I/O terminals) on the integrated circuit chip. The devices illustrated by FIG. 4A are electrically coupled to a shared data bus 2001. In addition, a wide data bus 2600 is provided that supports direct data dumping between the flash memory device 2300 and the RAM device 2400. A narrower data bus 2700 is also provide to support direct data transfer between the RAM device 2400 and the host interface 2500. The host interface 2500 may be electrically coupled through terminals to an external host processor (HOST) during normal operation. In a typical application, the width of the wide data bus 2600 may be greater than 32N for the case where the narrower data bus 2700 and shared bus 2001 have widths of N, where N is a positive integer (e.g., N=8, 16, 32, . . . ). Moreover, as illustrated by the block/timing diagram of FIG. 4B, a data dump operation that results in a large capacity data transfer from the flash memory device 2300 to the RAM device 2400 may be followed by a plurality of "parallel" operations that improve system efficiency. In particular, operations to transfer "dumped" data from the RAM device 2400 to the host via the host interface 2500 may be performed concurrently with operations to perform error detection and correction (EDC) on the data originating from the flash memory device 2300. These EDC operations may be performed by the processing unit 2100, which receives many cycles of the "dumped" data directly from the flash memory device 2300, via the narrower shared data bus 2001.

Figure 5:
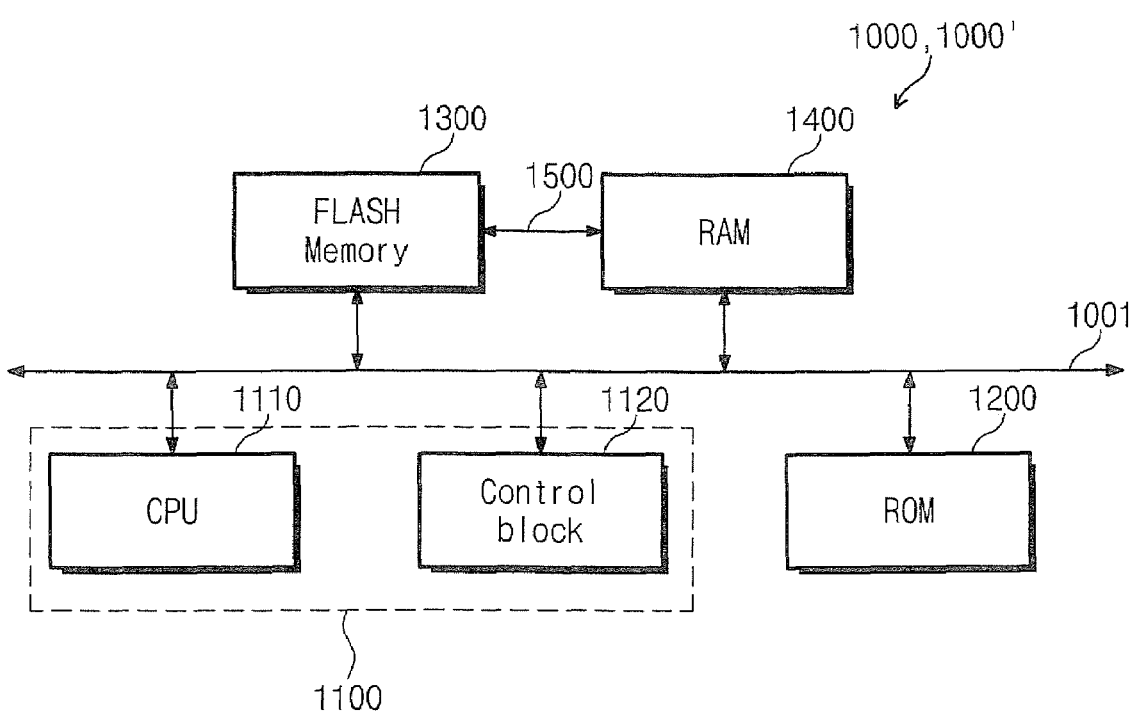
FIG. 5 is a block diagram of the high speed memory systems of FIGS. 2A-2B and 3A-3B, with additional system components illustrated.

Finally, as illustrated by the block diagram of FIG. 5, the memory systems 1000 or 1000' described herein may include a processing unit 1100 and a read-only memory (ROM) 1200, which are electrically coupled to the shared data bus 1001. This processing unit 1100 may include a central processing unit CPU 1110 and a control logic block 1120, which are independently connected to the shared data bus 1001 to thereby provide greater control over data flow operations within the memory system.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
    a random access memory (RAM) array having a plurality of columns of RAM cells therein and a first plurality of bit lines electrically connected to the plurality of columns of RAM cells;
    a non-volatile memory array having a plurality of columns of non-volatile memory cells therein and a second plurality of bit lines electrically connected to a plurality of columns of non-volatile memory cells;
    a data transfer circuit electrically connected to the first and second pluralities of bit lines, said data transfer circuit configured to support direct bidirectional communication between the first and second pluralities of bit lines when transferring non-volatile memory data directly from the second plurality of bit lines to the first plurality of bit lines and transferring RAM data directly from the first plurality of bit lines to the second plurality of bit lines; and a page buffer electrically coupled to the second plurality of bit lines, said page buffer configured to drive the second plurality of bit lines with data read from said non-volatile memory array when said data transfer circuit is enabled to support transfer of non-volatile memory data from the second plurality of bit lines to the first plurality of bit lines.

2. The integrated circuit device of claim 1, wherein said data transfer circuit comprises a plurality of transmission gates electrically connected in series between corresponding ones of the first plurality of bit lines and corresponding ones of the second plurality of bit lines.

3. The integrated circuit device of claim 1, wherein said data transfer circuit comprises a plurality of transmission gates electrically connected in series between corresponding ones of the first plurality of bit lines and corresponding ones of the second plurality of bit lines.

4. The integrated circuit device of claim 1, further comprising a RAM page buffer electrically connected to the first plurality of bit lines.

5. The integrated circuit device of claim 4, wherein said RAM page buffer is configured to read data from said non-volatile memory array when said data transfer circuit is enabled to support transfer of non-volatile memory data from the second plurality of bit lines to the first plurality of bit lines.

6. The integrated circuit device of claim 1, further comprising a first plurality of complementary bit lines associated with said RAM array and a plurality of tri-state inverters having inputs and outputs electrically connected to corresponding ones of the first plurality of bit lines and corresponding ones of the first plurality of complementary bit lines, respectively.

7. The integrated circuit device of claim 6, further comprising an array of sense amplifiers electrically connected to the first plurality of bit lines and the first plurality of complementary bit lines.

8. An integrated circuit chip, comprising:
a random access memory (RAM) device comprising a plurality of columns of RAM cells, a first plurality of pairs of complementary bit lines electrically connected to the plurality of columns of RAM cells and plurality of tri-state inverters having inputs and outputs electrically connected across corresponding ones of the first plurality of pairs of complementary bit lines;
a non-volatile memory device having a plurality of columns of non-volatile memory cells therein and a second plurality of bit lines electrically connected to a plurality of columns of non-volatile memory cells;
a data transfer circuit electrically connected to the second plurality of bit lines and true or complementary ones of the first plurality of pairs of complementary bit lines, said data transfer circuit configured to support direct bidirectional communication between the second plurality of bit lines and the true or complementary ones of the first plurality of pairs of complementary bit lines when transferring non-volatile memory data from said non-volatile memory device to said RAM device and transferring RAM data from said RAM device to said non-volatile memory device; and
a page buffer electrically coupled to the second plurality of bit lines, said page buffer configured to drive the second plurality of bit lines with data read from said non-volatile memory device when said data transfer circuit is enabled to support transfer of non-volatile memory device from the second plurality of bit lines to true or complementary ones of the first plurality of pairs of complementary bit lines.

9. The integrated circuit chip of claim 8, wherein said data transfer circuit comprises a plurality of transmission gates electrically connected in series between corresponding ones of the first plurality of pairs of complementary bit lines and corresponding ones of the second plurality of bit lines.

10. The integrated circuit chip of claim 8, further comprising a RAM page buffer electrically connected to the first plurality of pairs of complementary bit lines.

11. The integrated circuit chip of claim 10, wherein said RAM page buffer is configured to read data from said non-volatile memory device when said data transfer circuit is enabled to support transfer of non-volatile memory data from the second plurality of bit lines to corresponding ones of the first plurality of pairs of complementary bit lines.

12. An integrated circuit chip, comprising:
a RAM device having an array of RAM cells therein electrically connected to a first plurality of bit lines;
a non-volatile memory device having an array of NAND-type memory cells therein electrically connected to a second plurality of bit lines;
a data transfer circuit electrically connected to said first and second pluralities of bit lines, said data transfer circuit configured to support direct bidirectional communication between the first and second pluralities of bit lines when transferring non-volatile memory data directly from the second plurality of bit lines to the first plurality of bit lines and transferring RAM data directly from the first plurality of bit lines to the second plurality of bit lines; and
wherein said non-volatile memory device comprises a page buffer configured to drive the second plurality of bit lines with data read from said array of NAND-type memory cells when said data transfer circuit is enabled to support transfer of non-volatile memory data from the second plurality of bit lines to the first plurality of bit lines.

13. The integrated circuit chip of claim 12, further comprising:
a first input/output circuit electrically coupled to said RAM device; and
a second input/output circuit electrically coupled to said non-volatile memory device.

14. The integrated circuit chip of claim 13, wherein the integrated circuit chip includes a plurality of host interface terminals electrically coupled to said first input/output circuit.

15. The integrated circuit chip of claim 14, further comprising a processing circuit configured to perform error detection and correction operations on non-volatile memory data read from said second input/output circuit concurrently with operations to transfer data from said RAM device to the host interface terminals.

16. The integrated circuit chip of claim 15, wherein said processing circuit is further configured to perform the error detection and correction operations concurrently with operations to transfer data from said non-volatile memory device to said RAM device via said data transfer circuit.

* * * * *